(12) United States Patent
Jong

(10) Patent No.: US 6,408,696 B1
(45) Date of Patent: Jun. 25, 2002

(54) COHERENT PHASE LINE ENHANCER SPECTRAL ANALYSIS TECHNIQUE

(75) Inventor: Jen-Yi Jong, Huntsville, AL (US)

(73) Assignee: AI Signal Research, Inc., Huntsville, AL (US)

( * ) Notice: Subject to any disclaimer, the term of this patent is extended or adjusted under 35 U.S.C. 154(b) by 0 days.

(21) Appl. No.: 09/543,657

(22) Filed: Apr. 5, 2000

Related U.S. Application Data

(60) Provisional application No. 60/169,113, filed on Dec. 6, 1999.

(51) Int. Cl.[7] .................. G01H 9/00; G01R 23/16
(52) U.S. Cl. ................... 73/579; 324/76.21; 702/77
(58) Field of Search .................. 73/579, 570, 584, 73/593, 649, 659, 660; 702/56, 57, 66, 75, 76, 77; 324/76.19, 76.21; 340/680, 683

(56) References Cited

U.S. PATENT DOCUMENTS

| | | | |
|---|---|---|---|
| 4,352,293 A | | 10/1982 | Kurihara et al. |
| 4,408,285 A | | 10/1983 | Sisson et al. |
| 4,426,641 A | | 1/1984 | Kurihara et al. |
| 4,607,529 A | | 8/1986 | Morey |
| 4,901,244 A | * | 2/1990 | Szeto ............... 702/77 |
| 5,501,105 A | | 3/1996 | Hernandez et al. |
| 5,565,764 A | * | 10/1996 | Priebe et al. ........ 324/76.21 |
| 5,686,669 A | | 11/1997 | Hernandez et al. |
| 5,698,788 A | | 12/1997 | Mol et al. |

* cited by examiner

Primary Examiner—Richard A. Moller
(74) Attorney, Agent, or Firm—Waddey & Patterson; Larry W. Brantley

(57) ABSTRACT

A computer system and method for detecting periodic and quasi-periodic signals buried in wide-band noise is disclosed. For a signal containing periodic signals, the method includes the steps of segmenting the signal into an ensemble of block signals and performing a first Discrete Fourier Transform (DFT) on each block signal to obtain an ensemble of frequency signals containing complex data and frequency components. Next, the method includes the steps of defining an ensemble of complex frequency-time signals using the complex data from each frequency signal, performing a second DFT on each complex frequency-time signal to obtain an equivalent wave number signal for each frequency component, and identifying a peak magnitude component for each equivalent wave number signal. Finally, the method includes the steps of defining a window around each peak magnitude component associated with each frequency component, calculating a widow power for each window, and displaying the window power for each frequency component to form a CPLE power spectral density plot. For a signal containing a quasi-periodic signal, the method includes an initial step of transforming the quasi-periodic signal into a periodic signal. The method enhances detection by increasing the signal to noise ratio of the periodic and quasi-periodic signals. In addition, the method provides an estimate of the frequency associated with, as well as, a CPLE coherence value for signals. The method is implemented using a software program and a conventional computer system.

27 Claims, 18 Drawing Sheets

COHERENT PHASE LINE ENHANCER SPECTRAL ANALYSIS TECHNIQUE

This application claims benefit of co-pending Provisional U.S. Patent Application Ser. No. 60/169,113 filed Dec. 6, 1999 and entitled "Coherent Phase Line Enhancer Spectral Analyzer."

BACKGROUND OF THE INVENTION

The present invention relates generally to a computer system and method for detecting periodic and quasi-periodic signals buried in wide-band noise. Specifically, this invention relates to a computer system and method for detecting periodic and quasi-periodic signals using a novel auto power spectral density plot.

The use of an auto power spectral density (PSD) function to detect periodic and quasi-periodic signals combined with wide-band noise is well known in the art. A conventional PSD plot of a signal containing periodic signals may be created by the steps of: 1) segmenting the signal into an ensemble of equal-size, adjacent block signals, 2) calculating a Discrete Fourier Transform (DFT) of each block signal to obtain an ensemble of frequency signals containing complex data associated with frequency components, or frequency spectra, the complex data including a magnitude component and a phase component; 3) calculating a power component for each frequency component in each frequency signal using only the magnitude components from the complex data, 4) calculating an average power component for each frequency component by averaging the power components from each frequency signal, and 5) displaying the average power component for each frequency component.

Periodic signals appear as peak average power components in the PSD plot because the power associated with a periodic signal having a given frequency is concentrated around that given frequency. The average power component associated with wide-band noise, on the other hand, is spread over the entire range of frequencies in the PSD plot. Thus, a conventional PSD plot allows one to identify periodic signals based on the peak average power component in the PSD plot.

If the signal contains quasi-periodic signals, the quasi-periodic signals must be transformed into periodic signals before generation of a conventional PSD plot. Examples of signals that may include quasi-periodic signals include vibration signals obtained from rotary machines. PSD plots are typically used to analyze vibration signals in order to provide early detection of mechanical defects within the rotary machine. However, during steady state operation of a rotary machine, the shaft rotational speed tends to momentarily increase and decrease as a result of dynamic load variations on the shaft. As a result, all of the speed-related components of the vibration signal (e.g., synchronous harmonics, sub-harmonics, bearing signature, gear signature, etc.) are quasi-periodic rather than purely periodic. Those skilled in the art will recognize that generating a conventional PSD plot of a quasi-periodic signal will result in a PSD plot that contains misleading information regarding the quasi-periodic signal. Thus, quasi-periodic signals must be transformed into periodic signals before generation of a conventional PSD plot.

Several methods for transforming a digital signal containing quasi-periodic signals are known in the art. Typically, prior art methods, such as the Order Tracking method, require the use of an additional pulse tachometer type sensor signal (also known as a key-phasor signal). The key phasor signal provides a measure of the time required for the shaft to complete one revolution. Using the key-phasor signal, the original signal, which is sampled with a uniform-time interval, is re-sampled with a fixed number of samples during each shaft revolution. Linear interpolation or spline curve fitting may be used for large speed variations. Within the re-sampled signal, quasi-periodic signals become periodic signals.

Conventional PSD plots, however, may not be used to detect weak periodic and quasi-periodic signals buried in wide-band noise. That is, periodic and quasi-periodic signals associated with a frequency in the PSD plot where the average power component of the frequency is less than the average power component of the wide-band noise. As a result, some periodic signals and quasi-periodic signals that may contain valuable information may not be detected.

For example, in the context of machinery vibration analysis, periodic and quasi-periodic signals typically represent mechanical defects in rotary machines. Small amplitude periodic signals correspond to small mechanical defects and large amplitude periodic signals correspond to large mechanical defects. Small amplitude periodic signals, in turn, correspond to small average power components in conventional PSD plots. Thus, the ability to identify periodic signals having small average power components corresponds to identifying small mechanical defects.

Identification of small mechanical defects is important because repairing small mechanical defects costs less then repairing large mechanical defects. In addition, failure to identify small mechanical defects may lead to mechanical failures that cause more serious damage to the rotary machine. In some cases, the damage may be so severe that the rotary machine must be replaced. Replacement of rotary machines is a very costly proposition.

To illustrate this problem, consider a signal containing five (5) periodic signals combined with wide-band noise. The first periodic signal has an amplitude of 50 and a frequency of 500 Hz, the second, an amplitude of 10 and a frequency of 1000.50, the third, an amplitude of 5 and frequency of 1501.00, the fourth, an amplitude of 1.0 and a frequency of 2001.5, and the fifth, an amplitude of 0.5 a frequency of 2502.0. The wide-band noise is Gaussian white noise.

A conventional PSD plot (also referred to as a Raw PSD) of the signal is shown in FIG. 1. The average power component associated with the first three periodic signals may be clearly identified as the peak average power components occurring at 500, 1000, and 1500 Hz and labeled A, B, and C, respectively. The peak average power components associated with the other two periodic signals are hidden under the average power associated with the Guassian White Noise. Thus, there is a need for a method of generating a PSD plot that may be used to detect periodic and quasi-periodic signals buried in wide-band noise.

In addition, conventional PSD plots generated using Fast Fourier Transforms (FFTs) also provide an estimate of the frequency of the detected periodic signal that is limited by the FFT used to calculate the DFTs. As a result of this limitation, the estimate of frequency may be inaccurate. Referring to FIG. 1, the convention PSD plot includes an estimate of the frequencies corresponding to peaks A, B, and C. The estimated frequency is 500 Hz for peak A, 1000 Hz for peak B, and 1500 Hz for peak C. Recall that the actual frequencies should be 500 Hz, 1000.50 Hz, and 1501.00 Hz. Thus, there is a need for a method of generating a PSD plot that provides an estimate that is more accurate, that is, that more closely corresponds to the actual frequency of the detected periodic signal.

As mentioned previously, conventional PSD plots may not be used to detect periodic and quasi-periodic signals buried in wide-band noise. In addition, there are no other known computer systems and methods for detecting periodic and quasi-periodic signals buried in wide-band noise. U.S. Pat. Nos. 5,698,788, 5,686,669, 5,501,105, 4,607,529, 4,426,641, 4,408,285, and 4,352,293 teach various computer systems and methods that may be used to detect periodic and quasi-periodic signals combined with wide-band noise. However, none of these patents teach a computer system and method that may be used to generate a PSD plot that may be used to detect periodic and quasi-periodic signals buried in wide-band noise.

What is needed, then, is a computer system and method for generating a novel PSD plot that may be used for detecting periodic and quasi-periodic signals buried in wide-band noise.

SUMMARY OF THE INVENTION

Accordingly, an object of the present invention is to provide a computer system and method for detecting periodic and quasi-periodic signals buried in wide-band noise.

Another object is to provide a computer system and method for detecting periodic and quasi-periodic signals buried in wide-band noise using a novel auto power spectral density (Coherent Phase Line Enhancer (CPLE) PSD) plot.

A further object of the present invention is to provide a computer system and method for calculating an estimate of each frequency in the CPLE PSD plot.

Another object of the present invention is to provide a computer system and method for calculating a CPLE coherence plot for a CPLE PSD plot.

Still another object is to provide a computer system and method for detecting a mechanical defect in a rotary machine using the CPLE PSD plot.

These and other objects are provided, according to the present invention, by a computer system containing a software program that causes the computer system to generate and display a CPLE PSD plot for a signal containing periodic and quasi-periodic signals buried in wide-band noise.

For signals containing quasi-periodic signals, the software program causes the computer system to transform the quasi-periodic signals into periodic signals (also referred to as discretization of the quasi-periodic signals) using Order Tracking (OT) or a Phase Synchronized Enhancement Method (PSEM).

After this transformation and, for signals containing only periodic signals, the software program causes the computer system to segment the signal into an ensemble of equal size, adjacent block signals (with or without overlapping), perform a DFT on each block signal to obtain an ensemble of frequency signals, each frequency signal containing complex data associated with frequency components, define a complex frequency-time signal for each frequency component using the complex data, perform a second DFT on each complex frequency-time signal to obtain an equivalent wave number signal for each frequency component, identify a peak magnitude component for each equivalent wave number signal associated with each frequency component, define a window around each peak magnitude component, calculate the power contained within each window for each frequency component, and display the window power for each frequency component to form the CPLE PSD plot.

The software program further causes the computer system to calculate an estimate of the frequency associated with and a CPLE coherence plot for detected periodic and quasi-periodic signals. The CPLE coherence plot is basically a measure of the discreteness of each frequency component.

In a first embodiment, the present invention is used to detect mechanical failures in rotary machines by identifying periodic, or quasi-periodic, signals in vibration signals containing wide-band noise obtained from the rotary machines. Periodic signals buried in wide-band noise do not appear as peaks in conventional PSD plots and, as a result, cannot be detected using conventional PSD plots. In this first embodiment, the present invention generates a CPLE PSD plot wherein periodic signals buried in wide-band noise appear as peaks and can be readily identified.

DESCRIPTION OF THE PREFERRED EMBODIMENTS

Figure 2:
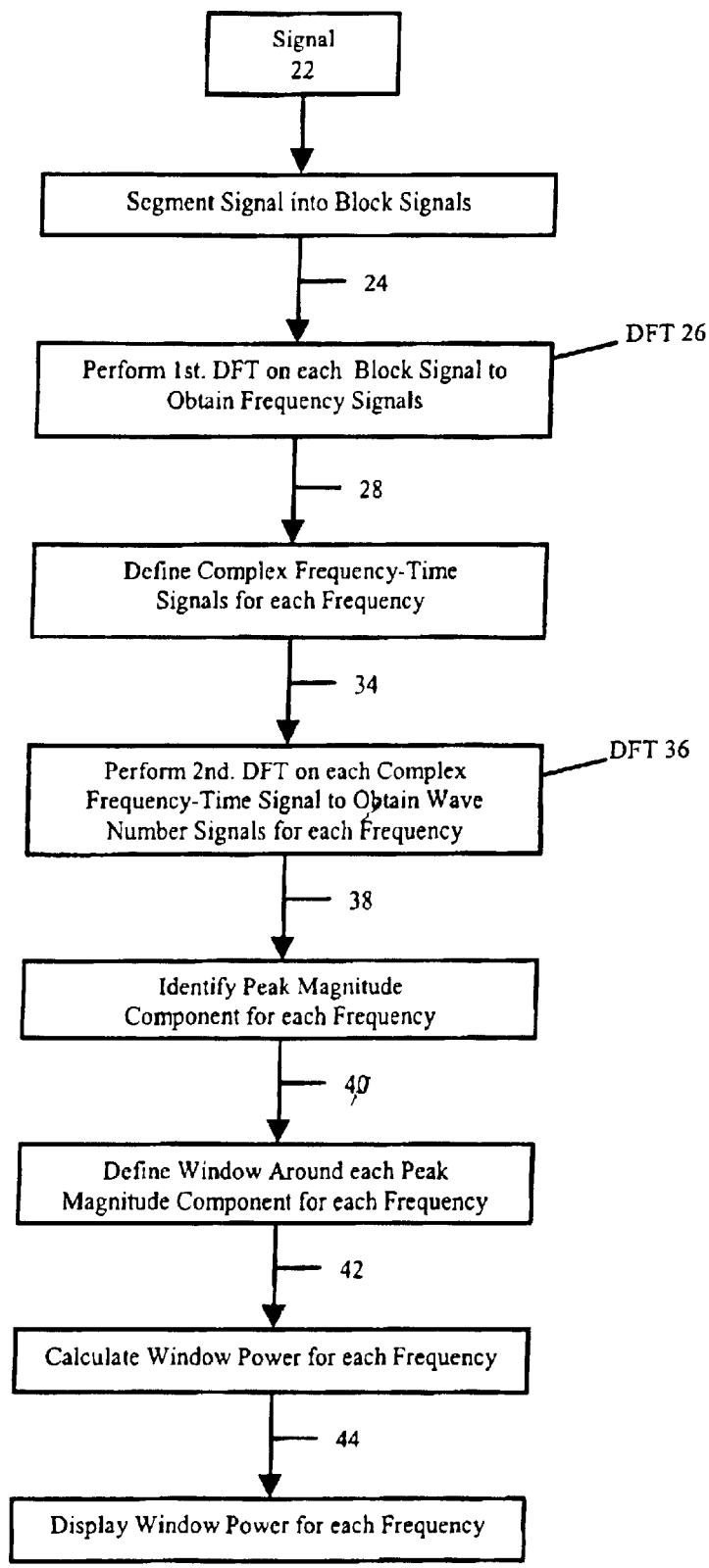
FIG. 2 is a flow chart showing the steps of the present invention.

Referring to FIG. 2, the method of the present invention includes the steps of: 1) segmenting a signal 22 into an ensemble of block signals 24, 2) performing a first Discrete Fourier Transform (DFT) 26 on each block signal 24 to obtain a frequency signal 28 containing complex data 30 (not shown) associated with frequency components 32 (also referred to simply as frequency) (not shown), 3) defining a complex frequency-time signal 34 for each frequency component 32 using complex data 30, 4) performing a second DFT 36 on each complex frequency-time signal 34 to obtain an equivalent wave number signal 38 for each frequency component 32, 5) identifying a peak magnitude component 40 for each equivalent wave number signal 38 associated with each frequency component 32, 6) defining a window 42 around each peak magnitude component 40, 7) calculating a window power 44 for each window 42, and 8) displaying window power 44 for each frequency component 32. If signal 22 contains a quasi-periodic signal, then method includes the initial step of transforming the quasi-periodic signal into a periodic signal using a PSEM technique or OT technique.

Figure 3:
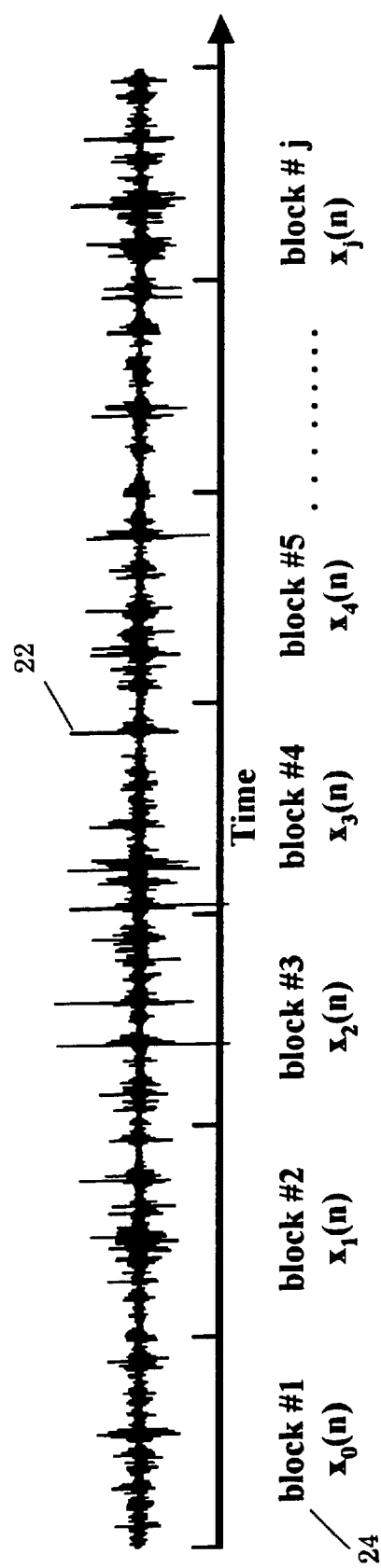
FIG. 3 is a plot illustrating the segmenting step of the present invention.

Referring to FIG. 3, a plot of the amplitude of a typical vibration data signal versus time is shown. Block signals 24 (also referred to as simply Block Number 1, Block Number 2, . . . , Block Number M) are created by segmenting signal 22 into M equal size, adjacent blocks. Each block signal 24 contains N real data points. For example, in one embodiment, M is equal to 200 and N is equal to 4096. That is, signal 22 is segmented into 200 equal size block signals 24, each block signal 24 containing 4096 data points. Forming block signals 24 is a step that is performed when generating conventional PSD plots and is well known in the art. As such, those skilled in the art will recognize that the number of block signals M and the number of real data points N may vary depending on the particular signal 22 subject to analysis.

DFT 26 is calculated using a Fast Fourier Transform (FFT) algorithm. The FFT algorithm is well known in the art and described in *Numerical Recipes in C*, William H. Press, Brian P. Flannery, Saul A. Teukolsky, William T. Vetterling, Cambridge University Press, 1990, p. 411–417. Other algorithms are known in the art as well and may also be used. Performing DFT 26 on block signals 24 to obtain frequency signals 28 is also a step that is required when generating a conventional PSD plot and, as a result, is well known in the art.

The DFT for a discrete time signal x[n], where n=0, 1, 2, . . . , N is defined as:

$$X(k) = \frac{1}{N}\sum_{n=0}^{N-1} x(n) W_N^{kn}$$

where k=0, 1, . . . , N−1. The Inverse Discrete Fourier Transform (IDFT) is given by:

$$x(n) = \sum_{k=0}^{N-1} X(k) W_N^{-kn}$$

where n=0, 1, . . . , N−1. In addition, $$W_N = e^{-j(2\pi/N)}$$

and $$\sum_{n=0}^{N-1} W_N^{kn} = N * \delta(k \pm I * N)$$

where I is equal to any integer number.

For a discrete-time periodic signal where $x(n)=A*\cos(\omega t+\phi))=A*\cos(\omega t-\theta)$, then $X(k)=0.5Ae^{j\phi}=0.5Ae^{-j\theta}$ and, if $x(n)=A W_n^{-\beta n}$, where n=0, 1, 2, . . . N−1, then the Fourier Transform is:

$$X(k) = \frac{1}{N}\sum_{n=0}^{N-1} A W_N^{-\beta n} W_N^{kn} = \frac{A}{N}\sum_{n=0}^{N-1} W_N^{(k-\beta)n} = A\delta[(k-\beta) \pm IN]$$

where the maximum peak of $|X(k)|$ occurs at $k=\beta \pm IN$ and Parseval's Relation may be written as:

$$\frac{1}{N}\sum_{n=0}^{N-1} |x(n)|^2 = \sum_{n=0}^{N-1} |X(k)|^2$$

If a discrete time signal is divided into M contiguous segments, with N points in each segment, where $x_i(n)$, n=0, 1, 2, . . . , N−1 represents the i-th segment of the discrete time signal, and $X_i(k)$, k=0, 1, 2, . . . , N−1 represents the DFT of the i-th segment of the discrete time signal, then the auto PSD S(k) is defined as $$S(k) = \frac{\frac{1}{M}\sum_{i=0}^{M} |X_i(\omega)|^2}{0.5\Delta}$$

where bandwidth, $\Delta$, equals $F_s/N$ and $F_s$=sampling frequency.

Referring back to FIG. 2, each frequency signal 28 is a complex signal including frequency components 32 (also referred to as a frequency spectra or frequency), each frequency component 32 is associated with one of the complex data 30. Each complex data 30 includes a real component 56 and an imaginary component 58. Those skilled in the art will recognize that real component 56 and imaginary component 58 may also be represented as a magnitude component 60 and a phase component 62. Thus, each frequency component 32 is associated with an ensemble of magnitude components 60 and phase components 62, each magnitude and phase component, 60 and 62, associated with a different frequency signal 28.

Up to this point, the steps included in the method of the present invention have followed the steps required for the generation of a conventional PSD plot. Step 3, however, defining an ensemble of complex frequency-time signals 34, is a step that is not required for generation of a conventional PSD plot.

To generate a conventional PSD plot, magnitude component 60 for a given frequency component 32 in a given frequency signal 28 is used to calculate a power component 66 for the given frequency component 32. Phase component 62 is not used to perform this step. This step is repeated for each frequency component 32 in each frequency signal 28. Thus, each frequency component 32 has an ensemble of associated power components 66.

Figure 4:
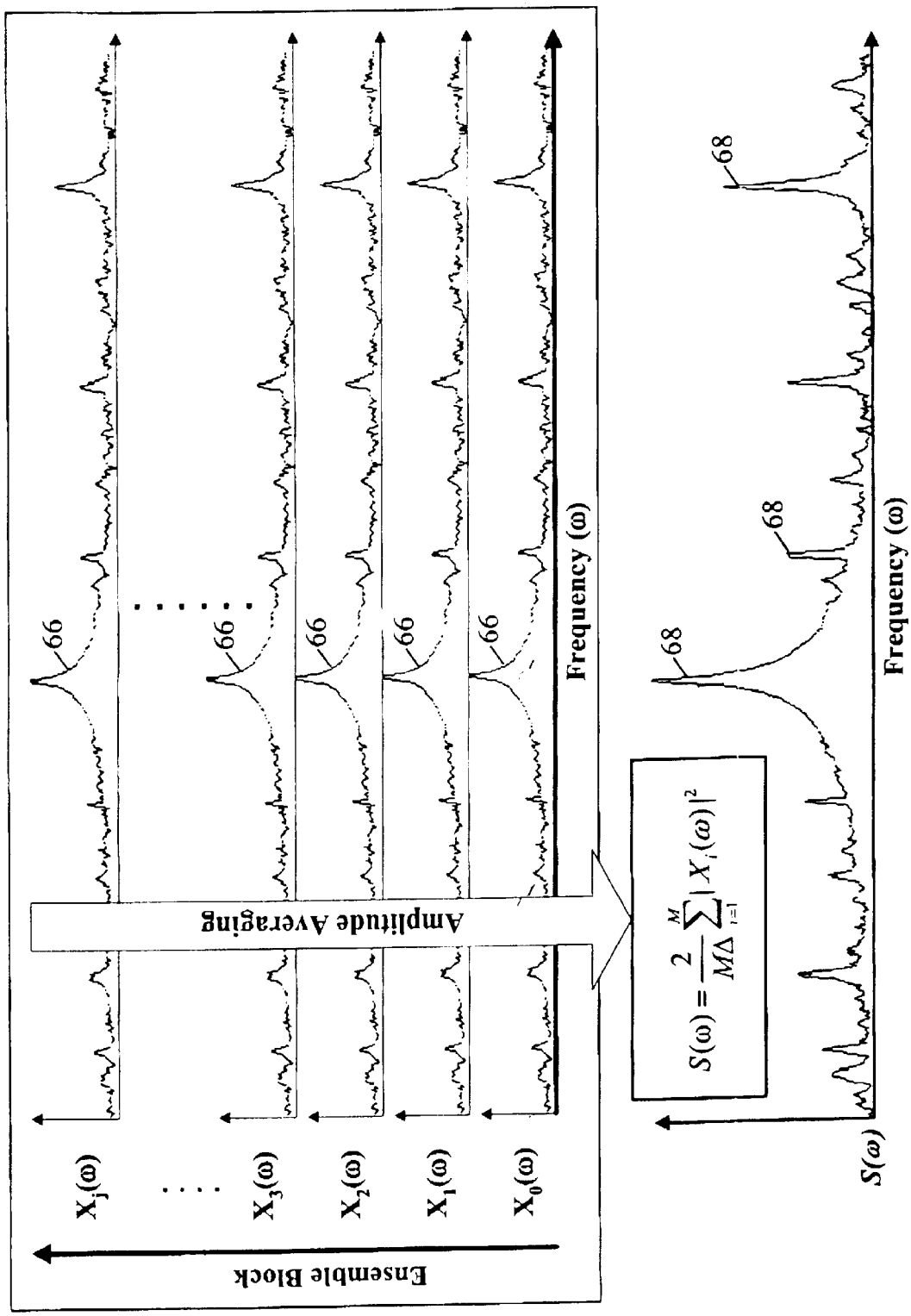
FIG. 4 is a plot showing the ensemble averaging typically used to generate a convention PSD plot.

An average power component 68 is then calculated for a given frequency component 32 by averaging the ensemble of power components 66 associated with the given frequency component 32. This step is repeated for each frequency component 32. Thus, each frequency component 32 has an average power component 68. This step is commonly referred to as ensemble averaging. The resulting ensemble of average power components 68 is then displayed or plotted as a conventional PSD plot. (See FIG. 4).

Figure 5:
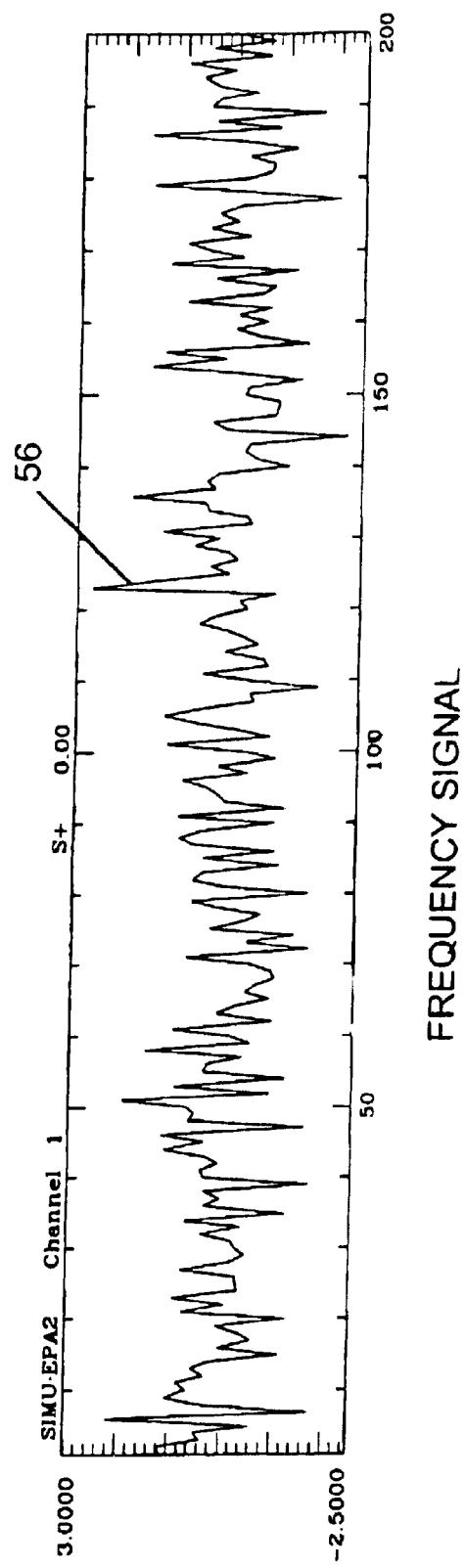
FIG. 5 is a plot of a real component of the complex frequency-time signal for a given frequency component.
Figure 6:
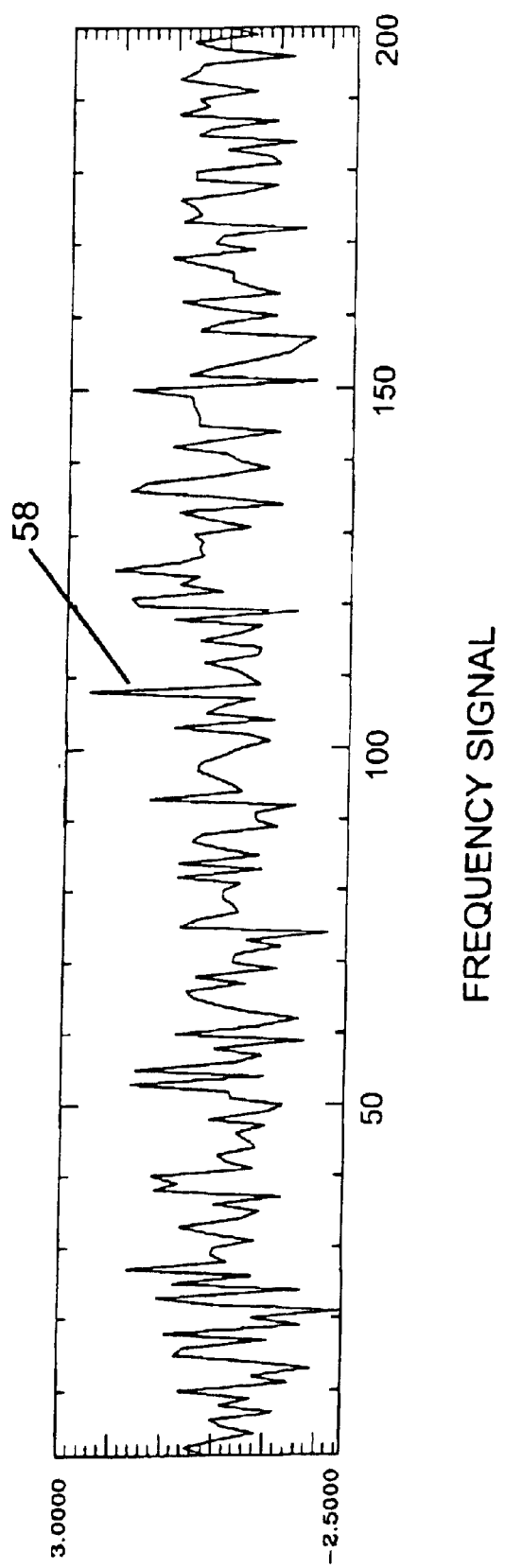
FIG. 6 is a plot of an imaginary component of the complex frequency-time signal for a given frequency component.

Rather than performing an ensemble averaging, complex frequency-time signal 34 is defined for each frequency component 32. Complex frequency-time signal 34 for a given frequency component 32 includes real and imaginary components, 56 and 58, from each frequency signal 28. To illustrate this concept, consider FIG. 5. FIG. 5 shows a plot of real component 56 from each frequency signal 28 for a given frequency component 32. In other words, FIG. 5 is a plot of the real components 56 with respect to frequency signal 28 for a given frequency component 32. FIG. 6 is a similar plot for imaginary components 58 for the same frequency component 32. To further illustrate this concept, consider the following.

The Fourier Transform of a periodic signal defined by $x(t)=A*e^{j[\omega t+\phi_0]}$ is $X(\omega)=2\pi*A*\delta(\omega-\omega_c)e^{j\phi}$. The Fourier Transform of a time-shifted version of $x(t)$, $x_m(t)=x(t+mT)= A*e^{j[\omega(t+mT)+\phi_u]}$, where $x(t)$ is shifted in time by $mT$, may be defined as:

$$x_0(t)=x(t) \Rightarrow X_0(\omega)=X(\omega)$$
$$x_1(t)=x(t+T) \Rightarrow X_1(\omega)=X(\omega)e^{j\omega T}$$
$$x_2(t)=x(t+2T) \Rightarrow X_2(\omega)=X(\omega)e^{j\omega 2T}$$
$$x_3(t)=x(t+3T) \Rightarrow X_3(\omega)=X(\omega)e^{j\omega 3T}$$
$$x_m(t)=x(t+mT) \Rightarrow X_3(\omega)=X(\omega)e^{j\omega mT}$$

Thus, complex frequency-time signals 34 may be defined as $$y(m)=X_m(\omega_c)=X(\omega_c)e^{j\omega_c mT}$$
$$y(m)=\{X_0(\omega_c), X_1(\omega_c), X_3(\omega_c), \ldots, X_{M-1}(\omega_c)\}$$
$$y(m)=X(\omega_c)\{e^{j0}, e^{j\omega_c T}, e^{j\omega_c T}, e^{j\omega_c 2T}, e^{j\omega_c 3T}, \ldots, e^{j\omega_c(M-1)T}\}$$
$$y(m) = X(\omega_c)e^{-j\frac{2\pi}{M}\{\frac{M}{2\pi}\omega_c Tm\}}$$
$$= X(\omega_c)W_M^{-\{\frac{M}{2\pi}\omega_c T\}m}$$
$$= X(\omega_c)W_M^{-\{\frac{\omega_c}{\omega_T}M\}m}$$

where $m=0, 1, 2, \ldots, M-1$, $$\omega_{T_t} = \frac{2\pi}{T}, \text{ and } f_T = \frac{1}{T}.$$

Step 4 requires the performance of a second DFT 36. DFT 36 is also implemented using the FFT algorithm. The FFT algorithm is designed to process both real and complex data. It should be noted that in Step 2, the FFT algorithm processes real data in block signals 24, while in step 4, the FFT algorithm processes complex data. By processing complex data, this step takes advantage of the coherent phase relationship that exists between the ensemble of frequency signals 28. Performing an FFT on complex data is a technique that is well known in the art.

Figure 7:
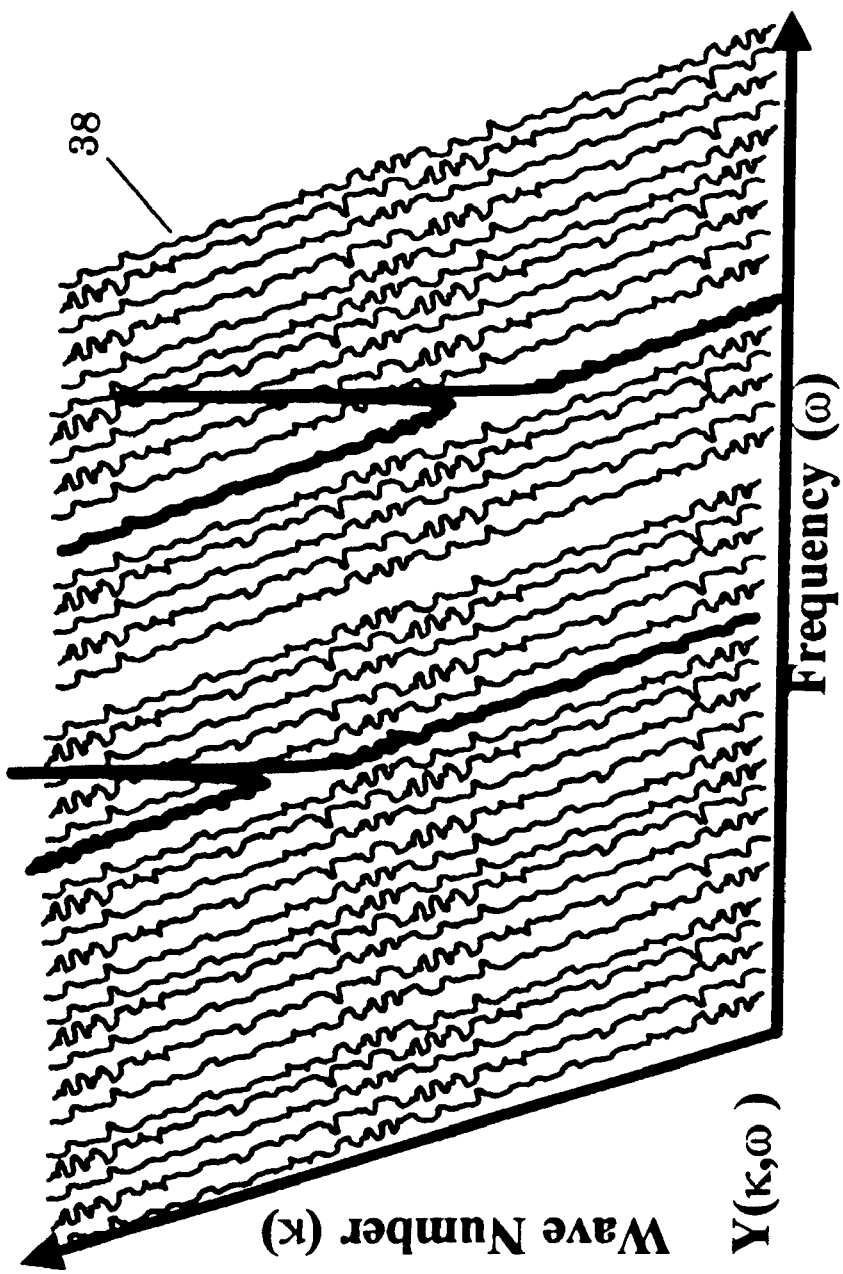
FIG. 7 is a plot of wave number versus frequency component (or frequency).

Each equivalent wave number signal 38 is associated with a single frequency component 32, each frequency component 32 is associated with complex data 70 (not shown), and each complex data 70 associated with a wave number 72 (shown in FIG. 7). Complex data 70 is not equal to complex data 30. Complex data 70 includes a real component 74 and an imaginary component 76. Those skilled in the art will recognize that real component 74 and imaginary component 76 may also be represented as a magnitude component 78 and a phase component 80. Thus, each frequency component 32 is associated with an ensemble of magnitude components and phase components, 78 and 80, each magnitude and phase component, 78 and 80, is associated with a different wave number 72. This concept is best illustrated in FIG. 7. A further illustration of this concept may be observed in FIG. 8, which is a plot of magnitude component 78 versus wave number 72 for a given frequency component 32, specifically 2002.5 Hz. Note that phase component 80 is not used to generate FIG. 8.

Using the definition of complex frequency-time signals 34 as defined above, equivalent wave number signal 38 may be defined as:

$$Y_k(\omega) = X(\omega_c)\delta\left[\left(\omega - \frac{f_c}{f_T}M\right) \pm I*M\right]$$
$$= X(\omega_c)\delta\left[\omega - \left(\frac{f_c}{f_T} \pm I\right)*M\right]$$

where T=Shifting time between blocks, $$\omega_{T_t} = \frac{2\pi}{T}, f_T = \frac{1}{T},$$

k is the discrete frequency index of $X(\omega)$ where $f_k=\omega_c$, W={0, 1, 2, . . . M-1}=Wave-number index, and wave number $$\gamma = \frac{w}{M} = \left(\frac{f_c}{f_T} \pm I\right) = \{-0.5 \text{ to } 0.5\}$$

(i.e., on the unit circle).

The maximum peak, or peak magnitude component 40, of Y(w), or equivalent wave number signal 38, occurs at $$w = \left(\frac{f_c}{f_T} \pm I\right)*M$$

with an amplitude equal to $|X(\omega_c)|$.

Step 5 simply requires identifying peak magnitude component 40 for each frequency component 32. For example, referring to FIG. 8, peak magnitude component 40 is located at a wave number of −0.4 and has a value of approximately 0.3. A frequency component 32 associated with a specific peak magnitude component 40 is also known as a peak frequency component 43.

Window 42 may vary in size. The smallest size includes only peak magnitude component 40 while the largest size includes all of the magnitude components 76 associated with a given equivalent wave number signal 38. When window 42 includes all of the magnitude components 76 for a given equivalent wave number signal 38, the resulting CPLE PSD plot is identical to a conventional PSD plot. This result occurs primarily because of Parseval's equation, an equation that is well known in the art, which basically states that the power contained in a given signal is equal to the power contained within a signal generated by taking the DFT of the given signal.

Calculating window power 44 for each window 42 is accomplished by calculating the power contributed to window 42 by each magnitude component 76 included in window 42. Calculating the power associated with a magnitude component is a technique that is well known in the art. Window power 44, and accordingly, the novel auto power spectral density plot, or CPLE auto power spectral density plot, of the present invention, is calculated using:

$$S_{CPLE}(k) = \frac{\sum_{w=w_{max}-NW}^{w_{max}+NW} cor * |Y_k(w)|^2}{0.5\,\Delta}$$

where $|Y_1(W)|^2$ occurs at $W_{Max}$, Cor=NFFTy/M=amplitude correction constant, NFFTy=number of blocks of data (or block signals 24), NW=number of 1-sided wave number bins to be included around the maximum peak at $Y(W_{Max})$ for $S_{CPLE}(k)$.

In a digital implementation, the number of data blocks M, or block signals 24, may not be equal to a power of 2. In this case, y(m), or complex frequency-time signals 34, needs to be padded with zeros for m=M to NFFTy (NFFTy is the next power of 2 number larger than M). Then, using Parseval's equation, $$\frac{1}{NFFTy}\sum_{m=0}^{NFFTy-1}|y(m)|^2 = \sum_{w=0}^{NFFTy-1}|Y(w)|^2 \quad \text{and}$$

$$\frac{1}{NFFTy}\sum_{m=0}^{NFFTy-1}|y(m)|^2 = \frac{M}{NFFTy}\left\{\frac{1}{M}\sum_{m=0}^{M-1}|y(m)|^2\right\}$$

$$= \frac{M}{NFFTy}\{Averaged|X_m(w)^2|\}.$$

Thus, $$Averaged|X_m(w)|^2 = \frac{NFFTy}{M}\sum_{w=0}^{NFFTy-1}|Y(w)|^2$$

$$= cor * \sum_{w=0}^{NFFTy-1}|Y(w)|^2$$

and cor=NFFTy/M.

Displaying window power 44 for each frequency component 32 using a conventional computer display yields a CPLE power spectral density plot. By using window 42, this method essentially calculates the window power primarily based on the power associated with the periodic signal. As a result, the contribution to the window power due to wide-band noise is reduced.

The amount of noise reduction is estimated by: $10*\log_{10}\{(2*NW+1)/NSEG\}$ dB, where NW is equal to the window size, or the number of 1-sided wave number bins to be included around peak magnitude component 40, and NSEG is the number of block signals 24. If the number of block signals 24 is not equal to a power of two, then the number of block signals 24 is increased, by padding with zeros, to the next highest number of block signals 24 equal to a power of two. Thus, the CPLE PSD is similar to a conventional PSD plot wherein the wide-band noise power component for each frequency component 32 has been removed by windowing.

If a periodic signal exists around frequency component $f_k$, then its actual frequency, $f_{actual}$, is given by: $f_{actual}=f_k+((\beta*N_{ov}))*\Delta$, where $N_{ov}=(N/F_s)/T$=Overlap Number, $f_k$=discrete frequency of FFT X(k), $\beta=(f_c/f_T\pm I_0)$, $I_0$ is such that $\beta$ falls within $\{-0.5$ to $0.5\}$, and $(\beta*N_{ov})$ falls within $\{-0.5$ to $0.5\}$ (e.g., if $\beta=0.2$, $N_{ov}=4$, then $((\beta*N_{ov}))=((0.8))=-0.2.)$. $((\beta*N_{ov}))*\Delta$ is also referred to as the frequency correction value. Therefore, the effective frequency resolution of the CPLE spectrum equals: $\Delta_{CPLE}=\Delta/NSEG$, where NSEG=Total number of non-overlap data blocks (NSEG=M for non-overlap processing).

Various prior art methods exist for converting quasi-periodic signals into periodic signals. The present invention contemplates using any one of these prior art methods. In addition, another method, PSEM, described in a paper entitled "Phase Synchronized Enhancement Method for Space Shuttle Main Engine Diagnostics," *NASA* 1994 *Conference on Advanced Earth-to-Orbit Propulsion Technology*, May 1994, may be used as well.

The method of the present invention also provides a CPLE coherence function, CPLE-COH. The CPLE coherence function is simply a normalized CPLE PSD resulting from the ratio of a CPLE PSD plot and a conventional PSD plot. For a periodic signal, the CPLE-COH will approach 100%, while for wide-band noise the CPLE-COH will converge to zero. Thus, the CPLE-COH is a measure of the discreteness of a frequency component.

The power of a periodic signal in the wave number domain (See FIG. 7) will be concentrated around wave number $W_{max}$ (the wave number associated with a peak magnitude component 40), which corresponds to a wave number $\beta$ at a normalized wave number within the range of $-0.5$ to $0.5$. The wave number domain is simply a plot of the equivalent wave number signal 38 magnitude versus frequency component 32 (see FIG. 7). For wide-band noise, the signal power will be spread over the entire wave number range. Therefore, a CPLE coherence can be defined as the ratio of power around $W_{max}$ to the total power in a given wave number range and can be used to measure the discreteness of a spectral component (i.e., frequency component 32). This relationship may be described mathematically as:

$$CPLE - COH(f) = \frac{CPLE - PSD(f)}{PSD(f)}.$$

For a machinery diagnostic application, after the vibration measurement is speed normalized with Order Tracking (OT) or PSEM re-sampling, the speed-related components are periodic. The CPLE-COH then reduces to an RPM-COH. The RPM-COH is a quantitative measure of the degree of correlation of any vibration component with respect to speed (RPM), an important dynamic characteristic of a machinery vibration component.

Figure 9:
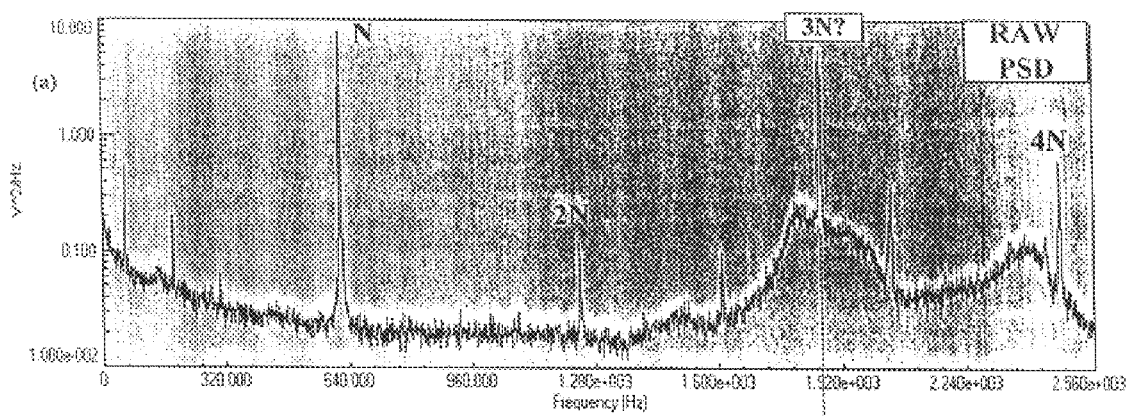
FIG. 9 is a conventional PSD for a vibration signal generated from an HPFP accelerometer on a Space Shuttle.
Figure 10:
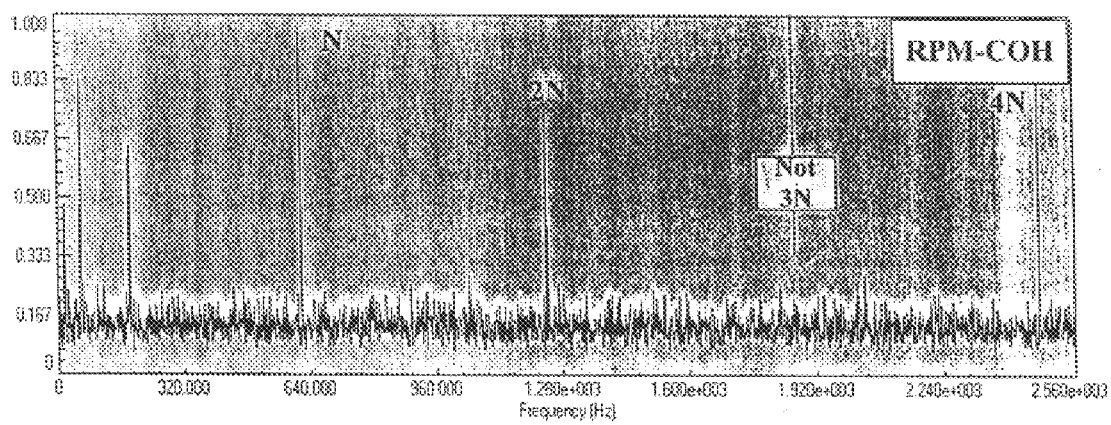
FIG. 10 is a CPLE-COH (in the form of a RPM-COH) for the HPFP accelerometer vibration signal.

To illustrate the RPM-COH function, consider FIGS. 9 and 10. FIG. 9 is a conventional PSD generated using a vibration signal generated from an HPFP accelerometer on a Space Shuttle. The peak marked "N" identifies the fundamental (Sync) frequency component, and the remaining peaks are its harmonics, 2N, 3N, and 4N. In this conventional PSD, the 3N peak is abnormally high, possibly indicating a potential fault signature (such as rubbing, bent shaft, etc.) Referring to FIG. 10, a CPLE-COH (or in this case an RPM-COH) plot, indicates that this apparent fault is a false alarm. The strong (i.e., close to 100% or 1) RPM-COH at 2N and 4N indicates that 2N and 4N are true harmonics of the fundamental frequency component (Sync). The weak (i.e., close to zero) RPM-COH at 3N indicates that the peak at 3N in the conventional PSD is not a harmonic of the fundamental frequency component and, as a result, is not related to the machinery rotation.

The method of the present invention is implemented using a software program that is loaded into and executed by a computer system. The computer system includes an operating system, a hard drive, a CD-ROM input device, a floppy disk input device, and a display. Any number of other conventional computer systems may be used as well. Those skilled in the art will recognize that the display may be replaced with a machine-readable display as well.

The software program is written in C++. In an alternative embodiment, the software program is written in Visual Basic. The software program may be written in a variety of other software programming languages as well.

A simulation exercise was performed by the invention of the present invention to determine the effectiveness of the present invention. In this exercise, signal 22 contains five (5) periodic signals combined with wide-band noise. Signal 22 is sampled at a sampling frequency of 10,240 Hz and signal 22 may be further described as follows. The first periodic signal has amplitude A of 50 and a frequency of 500.00 Hz. The second periodic signal has amplitude B of 10 and a frequency of 1000.50. The third periodic signal has amplitude C of 5.0 and a frequency of 1501.00 Hz. The fourth periodic signal has amplitude D of 1.0 and a frequency of 2001.50 Hz. Finally, the fifth periodic signal has amplitude E of 0.5 and a frequency of 2502.00 Hz. Signal 22 also contains Gaussian White Noise (GWN) (wide band noise) having a standard deviation of 70.

Figure 1:
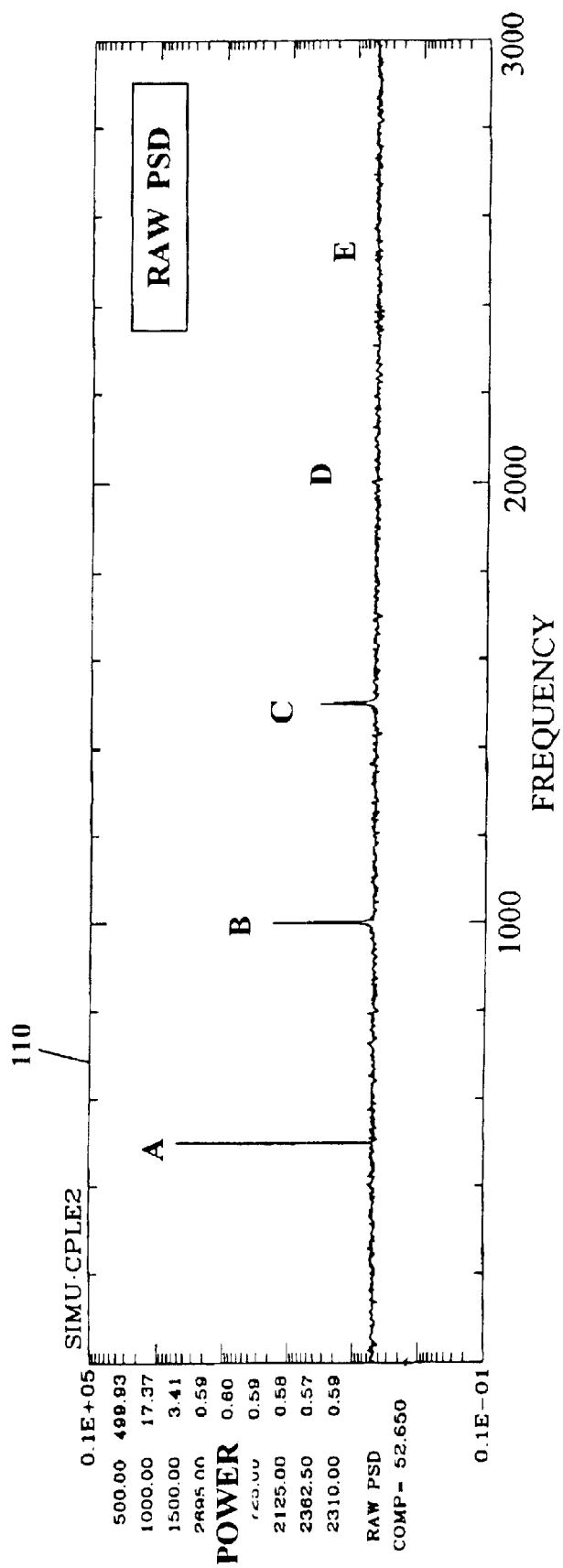
FIG. 1 is a conventional PSD plot of a signal containing five periodic signals combined with wide-band noise.

Referring to FIG. 1, a conventional PSD plot 110, two of the signals, D and E, are effectively buried under the wide-band noise and cannot be detected using conventional PSD plot 110. Although peak average power components A, B, and C appear at approximately, 500, 1000, and 1500 Hz, identifying periodic signals the first, second, and third periodic signals, no peak average power components appear at 2001.5 Hz or 2502.5 Hz to identify the fourth and fifth periodic signals.

Figure 11:
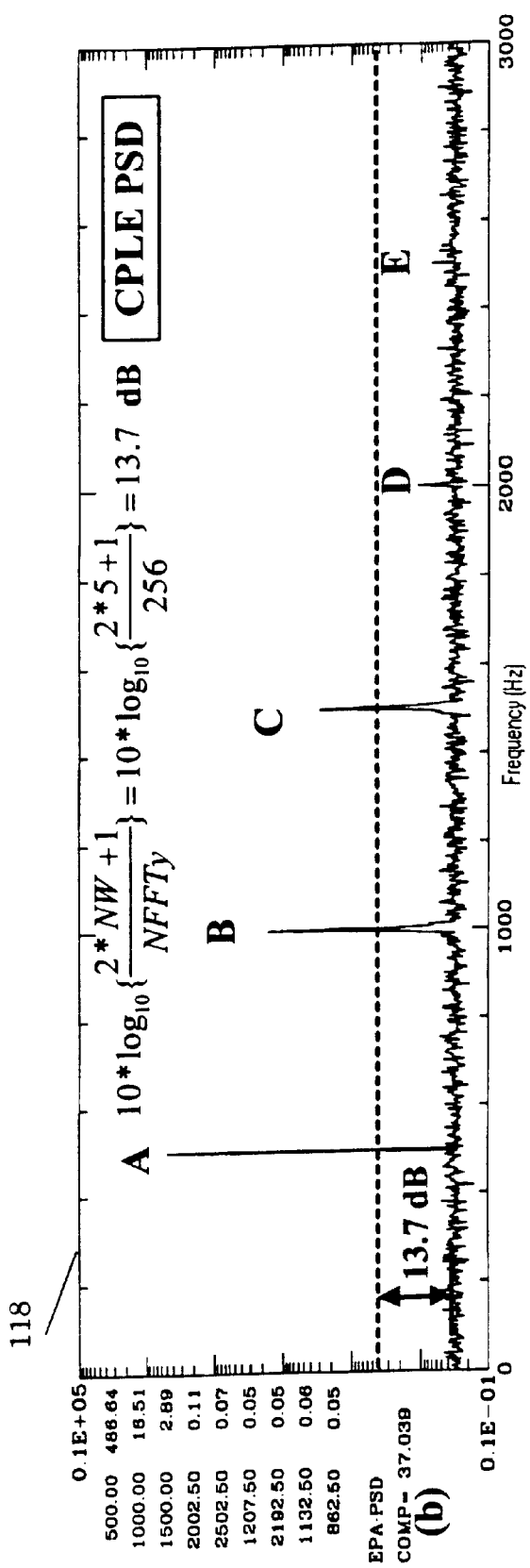
FIG. 11 is a CPLE PSD plot generated by the present invention using 200 block signals and a 4096-point DFT.

Using a CPLE PSD plot, periodic signals D and E may be identified. Referring to FIG. 11, a CPLE PSD plot 118 of signal 22 is shown. CPLE PSD 118 was generated by segmenting signal 22 into 200 block signals 24 and using a 4096-point FFT to generate CPLE PSD 118. A noise reduction gain of approximately 13.7 dB over a conventional PSD plot is achieved with this CPLE PSD plot. A peak power component D clearly appears at approximately 2001.5 Hz identifying the fourth periodic signal. The fifth periodic signal, however, is still not clearly visible on CPLE PSD plot 118.

Figure 12:
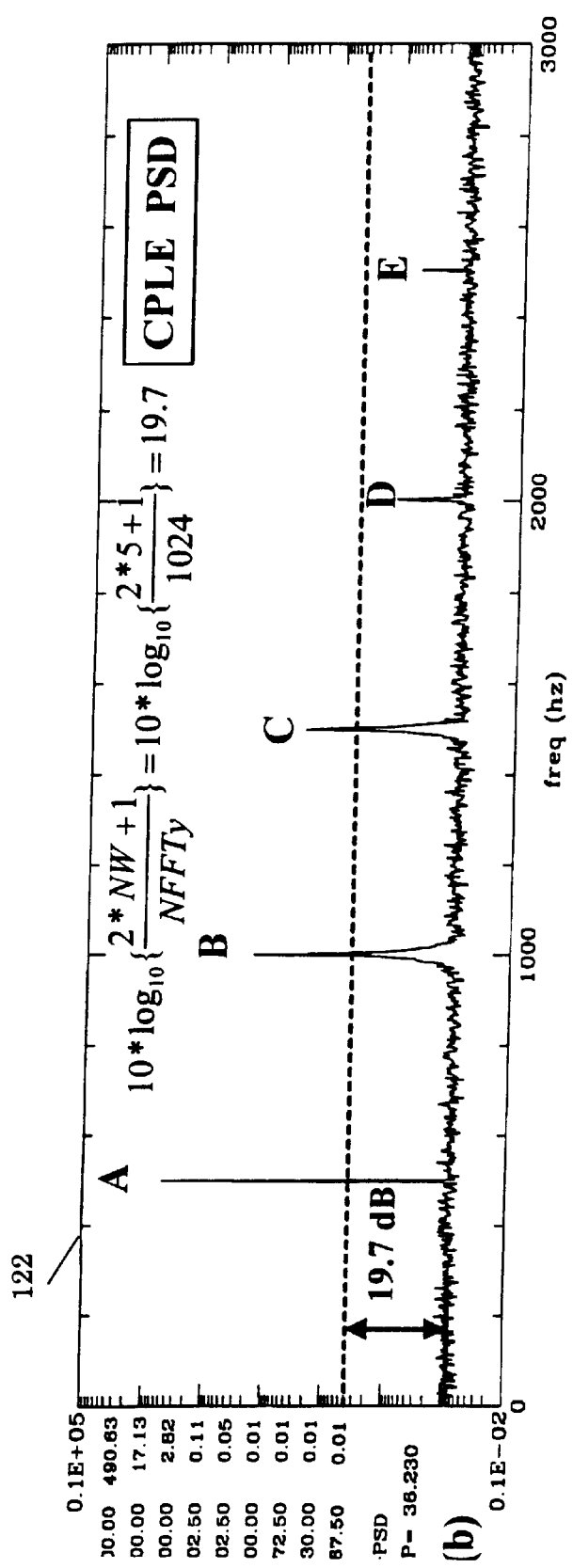
FIG. 12 is a CPLE PSD plot generated by the present invention using 1000 block signals and a 4096-point DFT.

Unlike conventional PSD plots, the signal to noise ratio for a signal may be increased by increasing the number of block signals 24 using to generate the CPLE PSD plot. CPLE PSD 122, shown in FIG. 12, was generated by using 1000 block signals 24 rather than 200 block signals 24. The fifth periodic signal, identified by a peak power component E appearing at approximately 2500 Hz is now clearly visible. The noise reduction gain, or increase in signal to noise ratio, for this CPLE PSD plot is approximately 19.7 dB over a conventional PSD plot.

Figure 8:
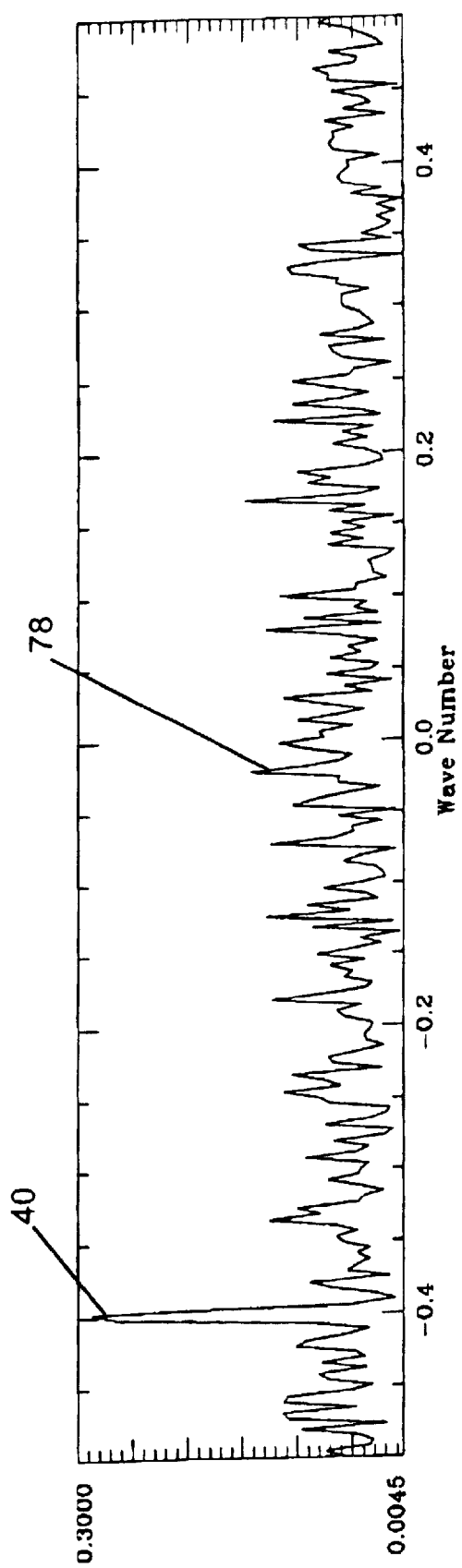
FIG. 8 is a plot of equivalent wave number signal magnitude versus wave number for a single frequency component.

Referring to FIG. 8, the actual frequency associated with the estimated frequency of 2002.5 Hz is given by: $f_k + \beta \Delta$, where $f_k$ is the estimated frequency component 32 of interest, $\beta$ is the wave number 72 associated with peak magnitude component 40, and $\Delta$ is a constant determined by the sampling frequency of signal 22 and the number of block signals 24. In this example, $\Delta$ is 10420/4096=2.5 Hz, $\beta$ is −0.4 (obtained from FIG. 8), and $f_k$ is 2002.5. Using these values yields an actual frequency of 2002.5+(−0.4)(2.5)= 2001.5 Hz. Thus, the present invention provides a more accurate estimate of the actual frequency of the fourth periodic signal D than a conventional PSD plot.

Figure 13:
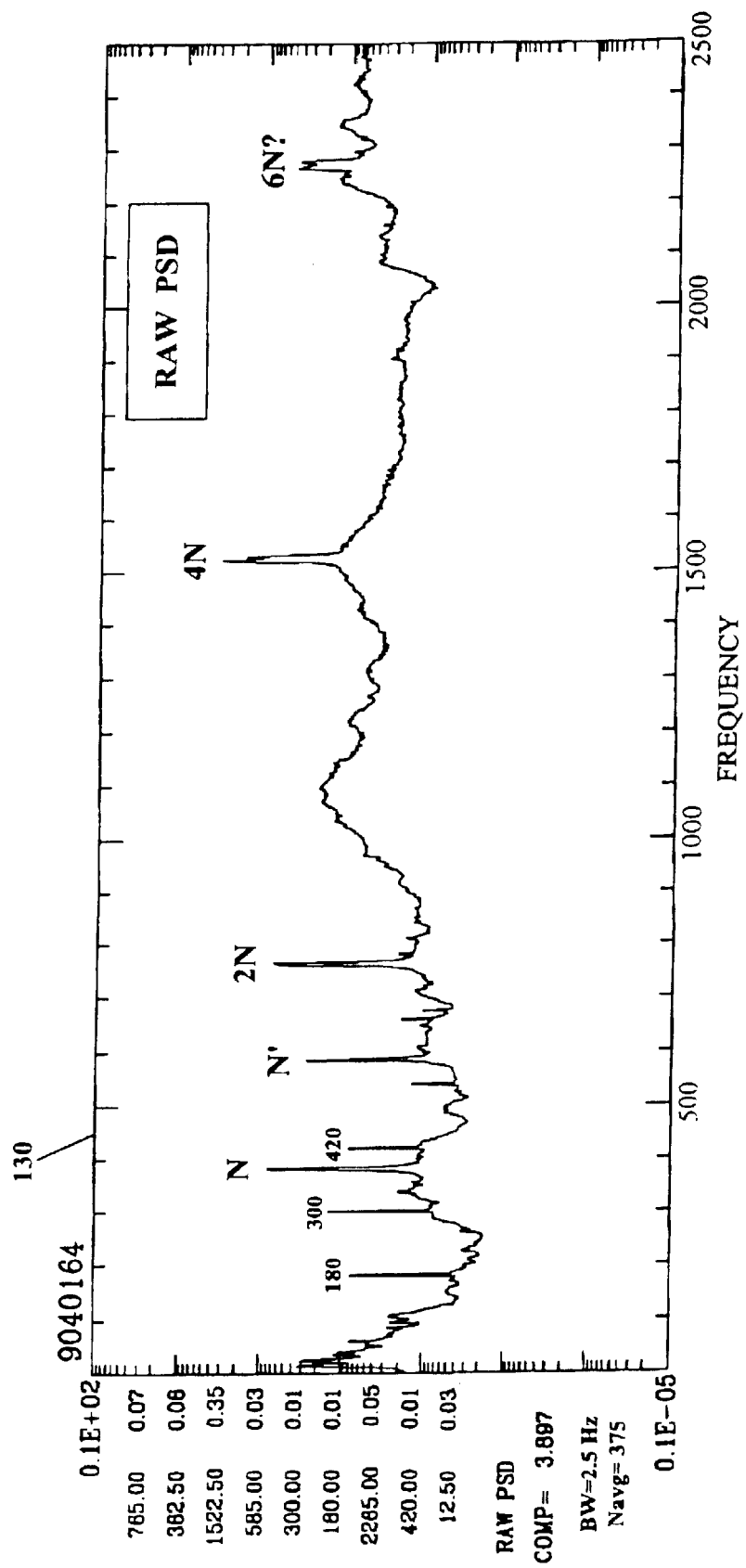
FIG. 13 is a conventional PSD plot of a vibration measurement signal from the Space Shuttle Main Engine (SSME).

Referring to FIGS. 13–16, another exercise was performed by the inventor of the present invention to determine the effectiveness of the computer system and method of the present invention. In this exercise, the signal (also referred to as the raw signal) is a vibration measurement signal obtained from a Space Shuttle Main Engine (SSME) HPOTP test firing. A conventional PSD 130 of the signal is shown in FIG. 13. The peaks marked as N, 2N, 4N, and possibly 6N are the Sync characteristic frequencies of the HPOTP. The peak magnitude marked N' is a Sync from a neighboring HPFTP. The peak magnitudes marked at 180, 300, and 420 Hz are harmonics of 60 Hz line noise.

Since the SSME HPOTP is a rotary machine having a shaft that is subjected to various loading conditions, the vibration measurement signal contains quasi-periodic signals. Thus, a direct application of the method of the present invention is not practical. In addition, a key-phasor signal is also unavailable for SSME HPOTP data. As a result, a PSEM transformation must be used to transform the quasi-periodic signals into periodic signals. In other words, the PSEM transform is used to calculate a PSEM signal.

Figure 14:
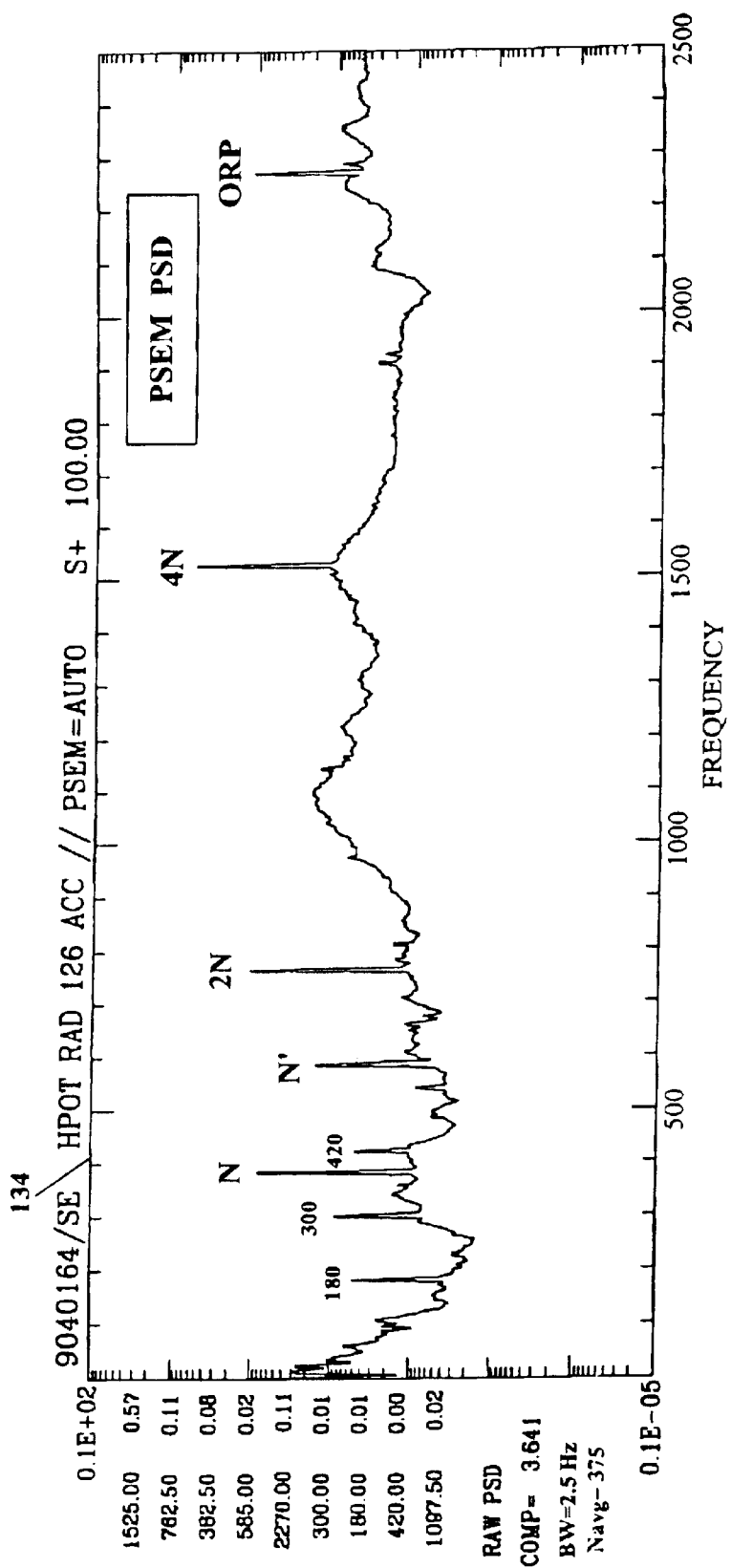
FIG. 14 is a conventional PSD plot of a signal generated using a PSEM transformation on the vibration measurement signal.

A PSEM PSD plot 134 (a conventional PSD plot using the PSEM signal) using 4N as the reference frequency is shown in FIG. 14. All of the sync-related components, N, 2N, 4N, and 6N, are clearly identified as discrete peaks in FIG. 14. This is expected since all of the sync-related components are harmonically related to the reference frequency 4N.

Figure 15:
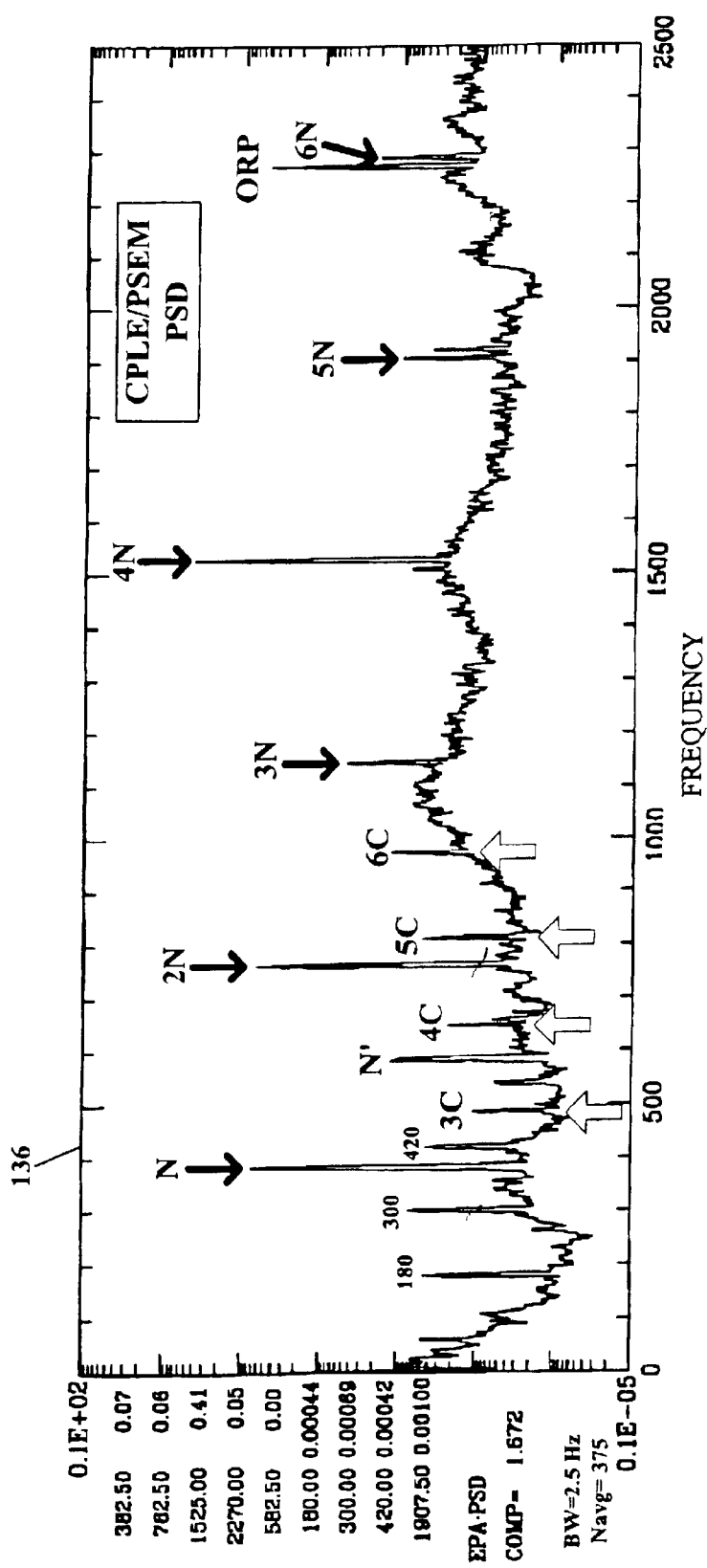
FIG. 15 is a CPLE PSD plot of the signal generated using a PSEM transformation on the vibration measurement signal.

A CPLE PSD plot 136 of the PSEM signal is shown in FIG. 15. Several additional peak magnitudes appear in CPLE PSD plot 136 of the PSEM signal as compared to conventional PSD plot 134 of the PSEM signal. Specifically, sync harmonics labeled 3N, 5N, and 6N, which could not be identified using conventional PSD plot 134, are visible. In addition, a sequence of equally spaced peaks, separated by approximately 162.14 Hz and labeled 3C, 4C, 5C, and 6C, appear between 500 Hz and 1200 Hz. These peaks were totaled obscured in both conventional PSD plot 130 of the signal and conventional PSD plot 134 of the PSEM signal. These peaks have been identified as the harmonics of the Cage Frequency of the Turbine End Roller Bearing (TERB). Thus, CPLE PSD plot 136 clearly allows one to identify quasi-periodic signals buried under wide-band noise.

Figure 16:
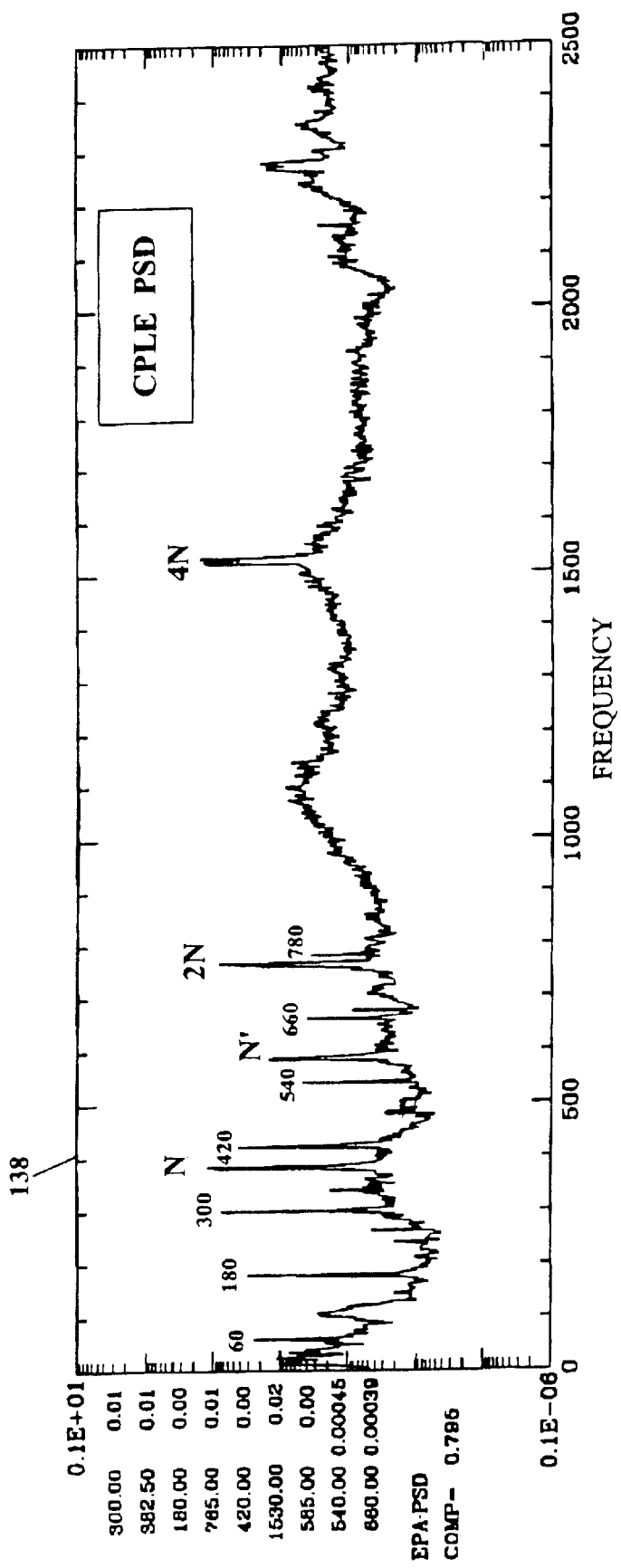
FIG. 16 is a CPLE PSD plot of the SSME vibration measurement signal.

To demonstrate how quasi-periodic signals effect a CPLE PSD, consider FIG. 16. FIG. 16 is a CPLE PSD plot 138 of the signal without transforming the quasi-periodic signals using some type of discretization process, such as OT or PSEM. As expected, the only enhanced components are the harmonics of 60 Hz line noise (e.g., 180, 300, 420, 540, 660, and 780 Hz), that is, the only purely periodic signals in the signal.

Figure 17:
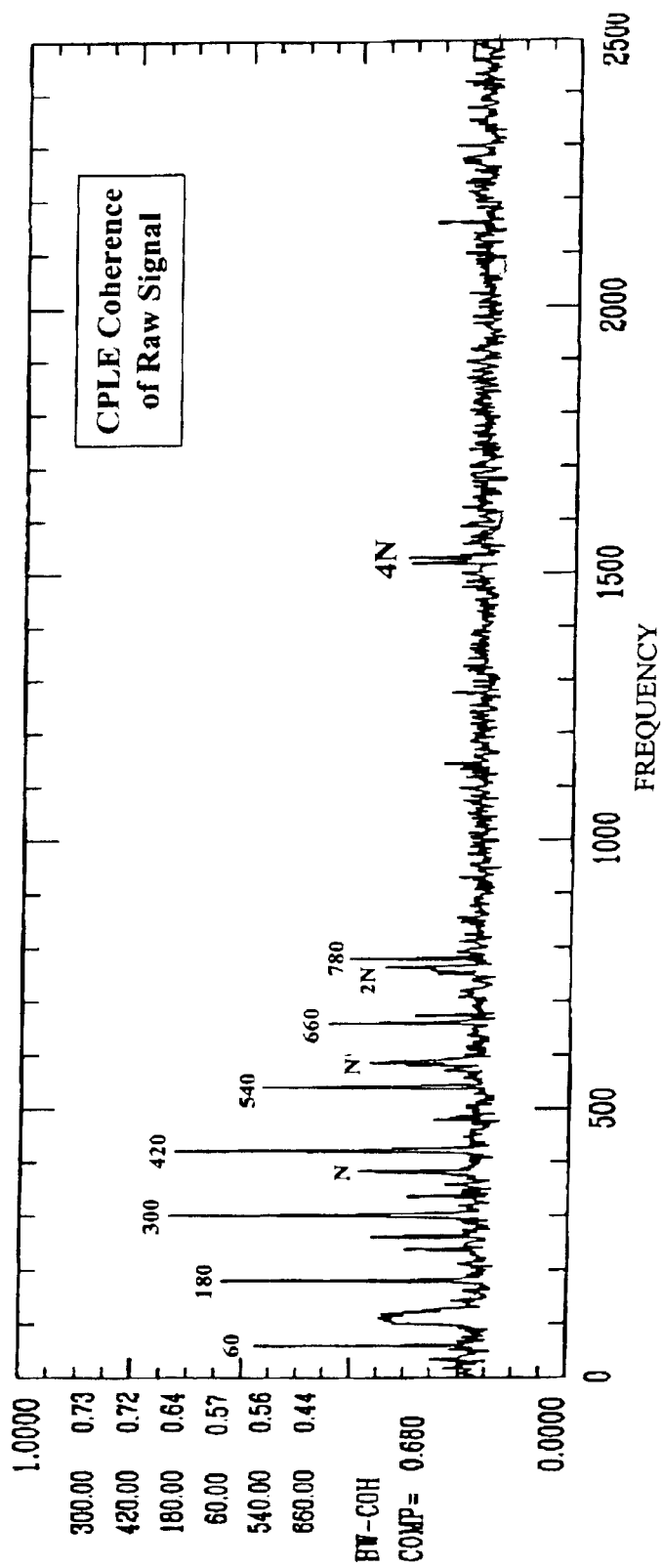
FIG. 17 is a CPLE coherence plot for the SSME vibration measurement signal.
Figure 18:
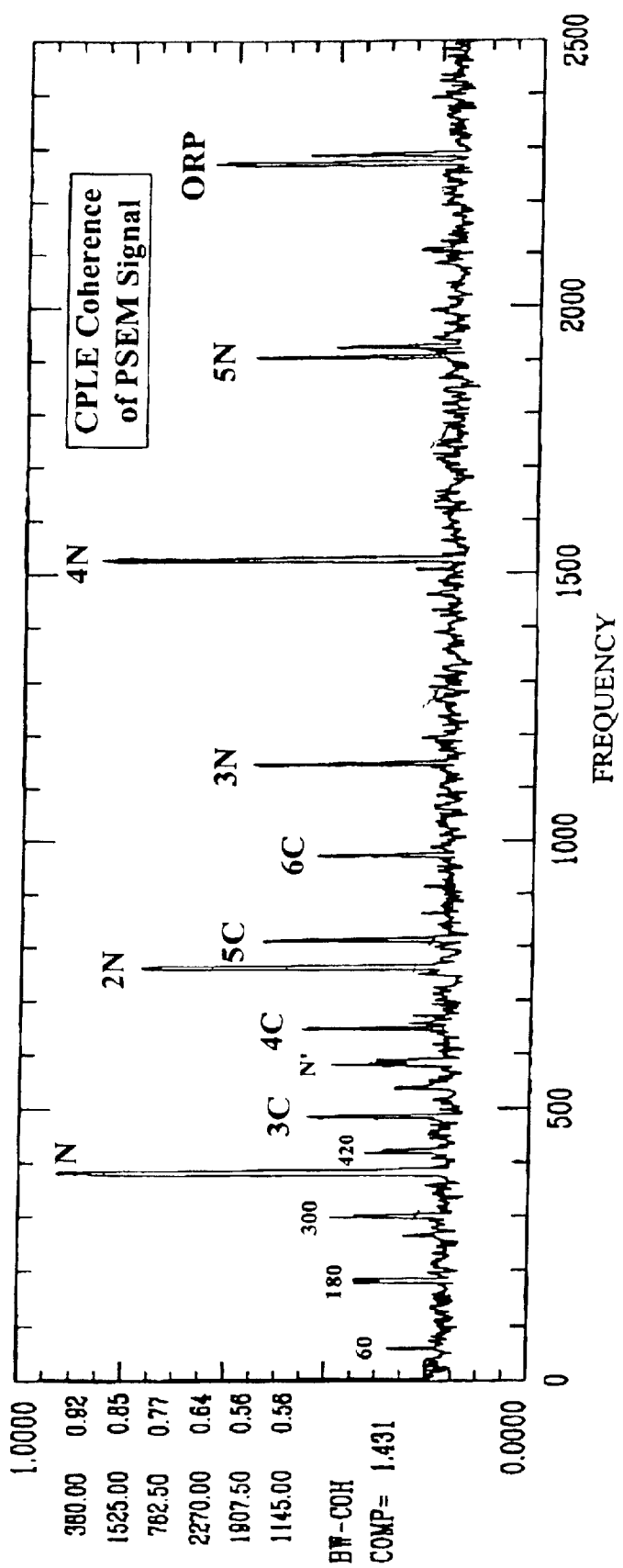
FIG. 18 is a CPLE coherence plot for a signal generated using a PSEM transformation on the SSME vibration measurement signal.

FIGS. 17 and 18 illustrate CPLE coherence plots for the raw signal and the PSEM signal, respectively. Referring to FIG. 17, strong CPLE coherence values occur at the harmonics of the 60 Hz line noise. The strong bandwidth coherence values occur because the 60 Hz line noise and the harmonics 50 of the 60 Hz line noise are periodic in the signal. In FIG. 18, strong bandwidth coherence values occur at speed related components, N, 2N, 3N, 4N, 5N, 3C, 4C, 5C, and 6C. The strong bandwidth coherence values in FIG. 18 occur because the speed related components are periodic in the PSEM signal.

Thus, although there have been described particular embodiments of the present invention of a new and useful Coherent Phase Line Enhancer Spectral Analysis Technique, it is not intended that such references be construed as limitations upon the scope of this invention except as set forth in the following claims.

The invention claimed is:

1. A method for detecting a periodic signal buried in wide-band noise in a signal using a CPLE power spectral density plot, comprising the steps of:

(a) segmenting the signal into a plurality of adjacent, equal-size, block signals;
(b) performing a first Discrete Fourier Transform on each block signal to obtain an ensemble of frequency signals, each frequency signal including complex data associated with frequency components;
(c) defining a complex frequency-time signal for each frequency component using the complex data from each frequency signal;
(d) performing a second Discrete Fourier Transform on each complex frequency-time signal to obtain an equivalent wave number signal for each frequency component;
(e) identifying a peak magnitude component for each equivalent wave number signal associated with each frequency component;
(f) defining a window around each peak magnitude component for each frequency component;
(g) calculating a window power for each frequency component;
(h) displaying the window power for each frequency component to obtain the CPLE power spectral density plot of the signal, wherein a peak component in the CPLE power spectral density plot represents the periodic signal.

2. The method of claim 1, wherein the step of performing a first Discrete Fourier Transform comprises performing a first Fast Fourier Transform and the step of performing a second Discrete Fourier Transform comprises performing a second Fast Fourier Transform.

3. The method of claim 1, further comprising the steps of:
(a) identifying a peak wave number component associated with the peak magnitude component in each equivalent wave number signal;
(b) identifying a peak frequency component associated with the peak magnitude component in each equivalent wave number signal;
(c) multiplying the peak wave number component by a predetermined constant to obtain a frequency correction value;
(d) summing the frequency correction value and the peak frequency component to obtain an estimate of an actual frequency associated with the periodic signal.

4. The method of claim 1, further comprising the steps of:
(a) dividing the power associated with each frequency component from the CPLE PSD by a power associated with each frequency component from a conventional PSD to obtain a CPLE coherence value for each frequency component; and
(b) displaying the CPLE coherence value for each frequency component.

5. The method of claim 1, wherein the signal contains a quasi-periodic signal and the method further comprises an initial step of transforming the quasi-periodic signal into a periodic signal using a predetermined transformation.

6. The method of claim 5, wherein the predetermined transformation is a PSEM transformation.

7. The method of claim 5, wherein the predetermined transformation is an OT transformation.

8. A method for detecting a mechanical defect in a rotary machine using a CPLE power spectral density plot, comprising the steps of:
(a) generating a vibration signal from the rotary machine, the vibration signal including a periodic signal representative of the mechanical defect in the rotary machine;
(b) segmenting the vibration signal into a plurality of adjacent, equal-size, block signals;
(c) performing a first Discrete Fourier Transform on each block signal to obtain an ensemble of frequency signals, each frequency signal including complex data associated with frequency components;
(d) defining a complex frequency-time signal for each frequency component using the complex data from each frequency signal;
(e) performing a second Discrete Fourier Transform on each complex frequency-time signal to obtain an equivalent wave number signal for each frequency component;
(f) identifying a peak magnitude component for each equivalent wave number signal associated with each frequency component;
(g) defining a window around each peak magnitude component for each frequency component;
(h) calculating a window power value for each frequency;
(i) displaying the window power for each frequency to obtain a CPLE power spectral density plot of the vibration signal, wherein a peak component in the CPLE power spectral density plot represents the mechanical defect in the rotary machine.

9. The method of claim 8, wherein the step of performing a first Discrete Fourier Transform comprises performing a first Fast Fourier Transform and the step of performing a second Discrete Fourier Transform comprises performing a second Fast Fourier Transform.

10. The method of claim 8, further comprising the steps of:
(a) identifying a peak wave number component associated with the peak magnitude component in each equivalent wave number signal;
(b) identifying a peak frequency component associated with the peak magnitude component in each equivalent wave number signal;
(c) multiplying the peak wave number component by a predetermined constant to obtain a frequency correction value;
(d) summing the frequency correction value and the peak frequency component to obtain an estimate of an actual frequency associated with the mechanical defect in the rotary machine.

11. The method of claim 8, further comprising the steps of:
(a) dividing the power associated with each frequency component from the CPLE PSD by a power associated with each frequency component from a conventional PSD to obtain a CPLE coherence value for each frequency component; and
(b) displaying the CPLE coherence value for each frequency component.

12. The method of claim 8, wherein the vibration signal includes a quasi-periodic signal and the method further comprises an initial step of transforming the quasi-periodic signal into a periodic signal using a predetermined transformation.

13. The method of claim 12, wherein the predetermined transformation is a PSEM transformation.

14. The method of claim 12, wherein the predetermined transformation is an OT transformation.

15. A system for identifying a signal containing a periodic signal that is at/east partially masked by one or more noise signals, comprising:

(a) a data input device operable to receive a data file containing a recording of the signal;

(b) a processor in communication with the data input device such that the processor can process the data file;

(c) computer software operatively associated with the processor and containing instructions that cause the processor to:

segment the data file into a plurality of adjacent, equal-size, blocks;

perform a first Discrete Fourier Transform on each block to obtain an ensemble of frequency blocks, each frequency block including complex data associated with frequency components;

define a complex frequency-time signal for each frequency component using the complex data from each frequency block;

perform a second Discrete Fourier Transform on each complex frequency-time signal to obtain an equivalent wave number signal for each frequency component;

identify a peak magnitude component for each equivalent wave number signal associated with each frequency component;

define a window around each peak magnitude component for each frequency component;

calculate a window power for each frequency component; and (d) a data output device in communication with the processor and operative to provide an indication to a user of the system of the window power for each frequency component in a CPLE power spectral density plot of the data file such that a peak component in the CPLE power spectral density plot represents the periodic signal.

16. The system of claim 15, wherein the first Discrete Fourier Transform comprises a first Fast Fourier Transform and the second Discrete Fourier Transform comprises a second Fast Fourier Transform.

17. The system of claim 15, wherein the computer software operatively associated with the processor further contains instructions that cause the processor to:

identify a peak wave number component associated with the peak magnitude component in each equivalent wave number signal;

identify a peak frequency component associated with the peak magnitude component in each equivalent wave number signal;

multiply the peak wave number component by a predetermined constant to obtain a frequency correction value; and sum the frequency correction value and the peak frequency component to obtain an estimate of an actual frequency associated with the periodic signal.

18. The system of claim 15, wherein the computer software operatively associated with the processor further contains instructions that cause the processor to:

divide the power associated with each frequency component from the CPLE PSD by a power associated with each frequency component from a conventional PSD to obtain a CPLE coherence value for each frequency component; and display the CPLE coherence value for each frequency component using the data output device.

19. The system of claim 15, wherein the signal includes a quasi-periodic signal and the computer software operatively associated with the processor further contains instructions that cause the processor to transform the quasi-periodic signal into a periodic signal using an OT transformation.

20. The system of claim 15, wherein the signal includes a quasi-periodic signal and the computer software operatively associated with the processor further contains instructions that cause the processor to transform the quasi-periodic signal into a periodic signal using a PSEM transformation.

21. A method for detecting and identifying a signal corresponding to a vibration generated by a rotating mechanical part, wherein the signal is at least partially obscured by noise signals, comprising the steps of:

(a) supplying the signal and the noise signals as a data file to a processor;

(b) processing the data file using the processor by:

segmenting the data file into a plurality of adjacent, equal-size, blocks;

performing a first Discrete Fourier Transform on each block to obtain an ensemble of frequency blocks, each frequency block including complex data associated with frequency components;

defining a complex frequency-time signal for each frequency component using the complex data from each frequency block;

performing a second Discrete Fourier Transform on each complex frequency-time signal to obtain an equivalent wave number signal for each frequency component;

identifying a peak magnitude component for each equivalent wave number signal associated with each frequency component;

defining a window around each peak magnitude component for each frequency component;

calculating a window power for each frequency component; and (c) displaying the window power for each frequency component to obtain a CPLE power spectral density plot of the data file, wherein a peak component in the CPLE power spectral density plot represents the signal.

22. The method of claim 21, wherein the step of performing a first Discrete Fourier Transform comprises performing a first Fast Fourier Transform and the step of performing a second Discrete Fourier Transform comprises performing a second Fast Fourier Transform.

23. The method of claim 21, further comprising the steps of:

identifying a peak wave number component associated with the peak magnitude component in each equivalent wave number signal;

identifying a peak frequency component associated with the peak magnitude component in each equivalent wave number signal;

multiplying the peak wave number component by a predetermined constant to obtain a frequency correction value; and summing the frequency correction value and the peak frequency component to obtain an estimate of an actual frequency associated with the periodic signal.

24. The method of claim 21, further comprising the steps of:

dividing the power associated with each frequency component from the CPLE PSD by a power associated with each frequency component from a conventional PSD to obtain a CPLE coherence value for each frequency component; and displaying the CPLE coherence value for each frequency component.

25. The method of claim 21, further comprising the step of:

using a sensor placed proximate to the rotating mechanical part to sense and convert the vibration of the mechanical part into the signal and the noise signals; and converting and formatting the signal and noise signals to form the data file.

26. The method of claim 21, wherein the signal includes a quasi-periodic signal and the method further includes the step of transforming the quasi-periodic signal into a periodic signal using a PSEM transformation.

27. The method of claim 21, wherein the signal comprises a quasi-periodic signal and the method further includes the step of transforming the quasi-periodic signal into a periodic signal using an OT transformation.

* * * * *